(12) United States Patent
Pahl

(10) Patent No.: US 9,194,057 B2
(45) Date of Patent: Nov. 24, 2015

(54) PRODUCTION OF RADIATION-RESISTANT FLUORIDE CRYSTALS, IN PARTICULAR CALCIUM FLUORIDE CRYSTALS

(75) Inventor: Ulrich Pahl, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1035 days.

(21) Appl. No.: 13/298,925

(22) Filed: Nov. 17, 2011

(65) Prior Publication Data

US 2012/0164061 A1 Jun. 28, 2012

Related U.S. Application Data

(60) Provisional application No. 61/414,519, filed on Nov. 17, 2010.

(30) Foreign Application Priority Data

Nov. 17, 2010 (DE) .......................... 10 2010 044017

(51) Int. Cl.
*C01F 11/22* (2006.01)
*C30B 11/02* (2006.01)
*C30B 29/12* (2006.01)
*C01F 11/02* (2006.01)
(Continued)

(52) U.S. Cl.
CPC ............... *C30B 29/12* (2013.01); *C01F 11/02* (2013.01); *C30B 11/04* (2013.01); *G02B 1/02* (2013.01)

(58) Field of Classification Search
CPC .......... C30B 11/02; C30B 11/04; C01F 11/22

USPC ...................... 423/490, 497; 117/76
See application file for complete search history.

(56) References Cited

U.S. PATENT DOCUMENTS 6,123,764 A    9/2000  Mizugaki et al.
6,451,106 B1 * 9/2002  Mayolet et al. .................. 117/11
(Continued)

FOREIGN PATENT DOCUMENTS

CN    1224695 A      8/1999
CN  101066775 A     11/2007
(Continued)

OTHER PUBLICATIONS

Office Action in corresponding German Application No. 10 2010 044 017.5, dated Jul. 11, 2011, along with an English translation.
(Continued)

*Primary Examiner* — Ngoc-Yen Nguyen
(74) *Attorney, Agent, or Firm* — Edell, Shapiro & Finnan, LLC

(57) ABSTRACT

A process for producing fluoride crystals, in particular calcium fluoride crystals, having high radiation resistance to ultraviolet radiation, which includes: provisioning of a crystal powder (6) containing alkali metal fluoride or alkaline earth metal fluoride to form a raw crystal mass, melting of the raw crystal mass in a crystal growing unit (11) and solidifiying of the molten raw crystal mass by cooling. In the process, an ammonium salt (7) of a complex fluoro acid and an aliphatic alcohol (8) are added to the crystal powder (6) or to the raw crystal mass, to decrease oxidic impurities. A fluoride crystal produced by the process and also an optical component formed from such a fluoride crystal are also disclosed.

15 Claims, 1 Drawing Sheet

(51) Int. Cl.
*C30B 11/04* (2006.01)
*G02B 1/02* (2006.01)

(56) References Cited

U.S. PATENT DOCUMENTS

2002/0189527 A1* 12/2002 Meyer-Fredholm ............ 117/19
2003/0160177 A1* 8/2003 Mayolet et al. ............... 250/372

FOREIGN PATENT DOCUMENTS

| DE | 10142651 A1 | 3/2003 |
| DE | 102009030203 A1 | 4/2010 |
| EP | 0869203 A2 | 10/1998 |
| EP | 0919646 A1 | 6/1999 |
| EP | 0939147 A2 | 9/1999 |
| GB | 1104182 A | 2/1968 |
| WO | 0125001 A1 | 4/2001 |

OTHER PUBLICATIONS

Ko, J.M. et al., "Czochralski growth of UV-grade CaF2 single crystals . . . ", J. Chrystal Growth 222, (2001), pp. 243-248.
Wilke, K.-Th., Kristall Zuechtung, Deutscher Verlag der Wissenschaft, Berlin 1988, pp. 630 ff.
English translation of Office Action in corresponding Chinese Application No. 201110365130.1, dated Jun. 1, 2015.
Yonghui. L., et al., "Preparation Technology of Hydrogen Fluoride from By-Product Fluosilicic Acid in Phosphate Fertilizer Production", Phosphate and Compound Fertilizer, vol. 25, 2010 (with English language abstract).

* cited by examiner

PRODUCTION OF RADIATION-RESISTANT FLUORIDE CRYSTALS, IN PARTICULAR CALCIUM FLUORIDE CRYSTALS

This application claims benefit of U.S. Provisional Application No. 61/414,519, filed on Nov. 17, 2010, which is incorporated in its entirety into the present application by reference. The disclosure of the present application is also based on German Patent Application DE 10 2010 044 017.5, also filed on Nov. 17, 2010, and which is also incorporated in its entirety into the present application by reference.

FIELD OF AND BACKGROUND OF THE INVENTION

The invention relates to a process for producing fluoride crystals, in particular calcium fluoride crystals, having high radiation resistance to ultraviolet radiation, which comprises: provisioning of a crystal powder containing alkali metal fluoride or alkaline earth metal fluoride to form a raw crystal mass, melting of the raw crystal mass in a crystal growing unit and solidifying of the molten raw crystal mass by cooling. The invention also relates to a fluoride crystal produced by this process and also an optical component produced from such a fluoride crystal.

Large format, highly homogeneous and ideally scattering-free single crystals (or ingots) of alkali metal fluorides or alkaline earth metal fluorides, in particular $CaF_2$, are typically produced in a one-stage or multistage process from a raw crystal mass in a growing furnace. Such crystals, in particular calcium fluoride crystals, have a high transmission at wavelengths in the (near) UV range, e.g. at 193 nm. These can therefore be used as transmissive optical elements, e.g. as lenses, prisms or the like in projection or illumination units or as beamforming elements in laser systems for microlithography. Apart from single crystals, it may also be possible to use crystalline fluoride materials which consist of a plurality of phases for producing optical components, as is described, for example, in GB 1 104 182.

Particularly when the crystal material is used in lens, illumination and laser system positions having a high radiation exposure, e.g. at energy densities greater than 50 mJ/cm$^2$, there is the problem that the crystal material is damaged by the hard UV radiation used, which is, for example, produced by an excimer laser, if the crystal material has structural crystal defects (flaws). Such structural crystal defects are defects in the crystal structure which can be caused, inter alia, by incorporation of foreign atoms or foreign particles during crystallization. Under intensive UV irradiation, color centers which irreversibly reduce the transmission of the crystal with increasing radiation dose are formed at the flaws. In the case of high-purity crystals, the absorption coefficient tends to a saturation value with increasing radiation dose; this saturation value can serve as a characteristic measure of the laser resistance of the fluorite material, as is described in DE 10 2009 030 203 A1 of the applicant.

It is basically known that structural crystal defects can be influenced by an appropriately controlled growth and heat treatment process. Thus, for example, EP 0 939 147 A2 discloses a process in which a single crystal of calcium fluoride having improved optical properties is produced by carrying out a heat treatment process having a specific temperature profile on this.

In particular, it is also known that even tiny amounts of oxygen (in the ppm range), which are introduced as a result of the technology into the raw crystal mass in a growing apparatus, cause undesirable chemical secondary reactions in the melt of the crystal starting material or the raw crystal mass. Such secondary reactions lead to formation of crystal defects by incorporation of foreign atoms or ions into the crystal lattice and also to precipitation of microscopically small particles of metal oxides, e.g. CaO, PbO, or MgO, and thus lead to impairment of the optical properties of the crystal due to absorption or scattering.

The formation of such oxygen defect sites can be influenced by use of an appropriate protective gas atmosphere and use of scavengers. A scavenger is a purifying agent, i.e. a substance which serves to remove impurities from the raw crystal material. In the case of fluoride-containing crystals, an oxygen scavenger such as $PbF_2$ is usually used for this purpose. It has been found that the addition of $PbF_2$ brings about chemical reactions which lead to substantial removal of oxides, hydroxides or water. Here, for example, substances which are volatile even several hundred degrees Celsius below the melting point of calcium fluoride, e.g. PbO etc., are formed in a temperature range from 600° C. to 900° C.

Here, the impurities vaporize or sublime into the atmosphere surrounding the crystal and can there be removed from the plant (the growing furnace). Such a procedure is described, for example, in K. Th. Wilke, Kristallzüchtung, Deutscher Verlag der Wissenschaft, Berlin 1988, page 630 ff. Impurities in the crystal which, for example, deposit along small-angle grain boundaries can also be minimized by such purification processes.

However, it is known from, for example, DE 101 42 651 A1 that the use of a crystalline scavenger in the form of $PbF_2$ can lead, from a laser resistance point of view, to not insignificant residues of foreign metal oxide (PbO) or fluoride ($PbF_2$) in the crystal and these cannot be completely removed by distillation/sublimation.

To solve this problem, it has been proposed in, for example, the article "Czochralski growth of VV-grade $CaF_2$ single crystals using $ZnF_2$ additive as a scavenger", J. Chryst. Growth 222, (2001), pages 243-248, that another metal fluoride, namely $ZnF_2$, be used instead of $PbF_2$ as scavenger. EP 0 869 203 A2, too, describes the production of a fluoride crystal, in which a scavenger in the form of $ZnF_2$ is used in a plurality of process steps. However, $ZnF_2$ and also the ZnO formed therefrom vaporize at higher temperatures than $PbF_2$ and PbO. In addition, Zn residues also cause absorptions in the UV wavelength range from 150 nm to about 170 nm and influence the laser resistance at 193 nm.

EP 0 919 646 A1 describes the production of calcium fluoride crystals using scavengers, e.g. Teflon, and/or metal fluorides, e.g. $PbF_2$, $CoF_2$ and $MnF_2$, but the above-described problems can also occur in the case of these scavenger materials. WO 01/025001 A1 also describes a process for producing fluoride crystals, in which use is made of a fluorinating material which is provided in the form of a solid, e.g. $PbF_2$, $NH_4F$, $NH_4F \cdot HF$ or polytetrafluoroethylene (Teflon), or in the form of a gas, e.g. in the form of HF, $F_2$ or $NF_3$.

DE 101 42 651 A1 proposes using a reactive gas which comprises at least one substance containing reactive fluorine in addition to the crystalline scavenger in order to avoid problems with scavenger residues. This is said to be able to minimize the proportion of residues of the scavenger, e.g. PbO, in the crystal. Thus, for example, it is proposed that $CF_4$, which reacts according to the equation $2PbO + CF_4 \rightarrow 2PbF_2 + CO_2$, be used as reactive gas. $PbF_2$ reformed in this reaction can react again with oxygen-containing compounds or, should a reaction partner no longer be present, the fact that it has a somewhat lower boiling point than PbO and is therefore easier to remove can be exploited. The second compound formed, viz. $CO_2$, is gaseous and can easily be removed under reduced pressure.

However, the process described in DE 101 42 651 A1 also has a number of disadvantages: since $PbF_2$ has, at atmospheric pressure, a boiling point which is only about 200° C. below that of PbO, the $PbF_2$ can remain and thus reduce the laser resistance. Although the vapor pressure of PbO (vapor pressure at 1500° C.-53.3 mbar (40 torr)) is a factor of about 10 lower than that of $PbF_2$ (vapor pressure at 1500° C.-600 mbar (450 torr)), it cannot be assumed that all of the lead (Pb) can be removed from the plant, since lead compounds can deposit, for example, in graphite linings or on difficult-to-access places in the growing furnace. Furthermore, a secondary reaction in the form of $PbO+CF_4 \rightarrow PbF_4+CO$ (redox reaction) can occur and carbon is incorporated in the form of graphite in the crystal (as black inclusions) as a result of the Boudouard equilibrium ($CO_2+C \leftrightarrow 2CO$), which likewise reduces the transmission and impairs other optical properties of the crystal.

OBJECTS AND SUMMARY OF THE INVENTION

It is an object of the invention to provide a process by which fluoride crystals having a high radiation resistance can be produced. A further object of the invention is to provide a fluoride crystal produced by the process and an optical component which is made from such a crystal.

These objects are addressed by a process of the type mentioned in the introduction, in which an ammonium salt of a complex fluoro acid and an aliphatic alcohol are added to the crystal powder or the raw crystal mass to reduce oxygen defect sites or to decrease oxidic impurities.

According to one formulation of the invention, the use of $PbF_2$ or other inorganic metal fluorides, e.g. $ZnF_2$, $CdF_2$, $CoF_2$, $SnF_2$, . . . , as scavenger is dispensed with entirely. In place of such scavengers, use is made of ammonium salts of complex fluoro acids and also an esterification agent in the form of an aliphatic alcohol in order to convert undesirable oxidic substances into fluoridic substances (e.g. $Ca(OH)_2$ into $CaF_2$). In a concerted process, an esterification reaction of the ammonium salt and the aliphatic alcohol (in which the ester of the alcohol and the respective fluoro acid and HF as intermediate are formed) is exploited in order to produce a fluoridic alkaline earth metal compound from the oxidic compound (e.g. $Ca(OH)_2+2HF \rightarrow CaF_2+2H_2O$). The ester formed can easily be removed under suitable process conditions (low vacuum, elevated temperature). The other reaction products ($NH_3$, $H_2O$) are gaseous or in vapor form, i.e. likewise volatile under suitable process conditions (low vacuum, elevated temperature). Condensed water can be removed azeotropically by a distillation. Thus, the oxygen defects in the crystal mass or the crystal powder and also the content of Pb, Zn, . . . compounds which decrease the laser resistance can be reduced and the laser resistance of the crystal material can thus be increased in the process of the invention. The ammonium salt and the aliphatic alcohol can here be added either to the crystal powder in order to purify the crystal powder in an aliphatic alcoholic suspension or a fluid-solid reaction can be carried out on the raw crystal mass introduced into the crystal growing furnace. In the following description, essentially the first process variant which is carried out in an aliphatic alcoholic suspension is described. However, the second process variant in which a fluid-solid reaction is carried out is likewise possible.

In one variant of the process, the complex fluoro acid is selected from the group consisting of: tetrafluoroboric acid, hexafluorophosphoric acid, hexafluorosilicic acid and hexafluorotitanic acid. Ammonium salts of complex fluoro acids other than those mentioned above can also be used in the process of the invention. The ammonium salts are typically mixed into the crystal powder in suspension before transfer to the crystal growing furnace or into the raw crystal mass. Possible reaction equations of the above fluoro acids with aliphatic alcohol (referred to as ROH) in suspension are shown below:

For hexafluorosilicic acid ($H_2SiF_6$):

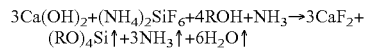

For hexafluorophosphoric acid ($HPF_6$):

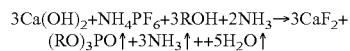

For tetrafluoroboric acid ($HBF_4$):

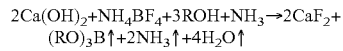

For hexafluorotitanic acid ($H_2TiF_6$):

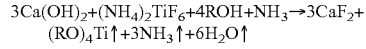

As stated above, the substances apart from $CaF_2$ which are formed in this reaction are gaseous or volatile and can thus be removed from the chemical plant or crystal growing unit by distillation or evacuation. The dry ammonium ($NH_3$) which participates as starting material in the above-described reactions is added to the reaction mixture via, for example, a gas inlet tube.

In a further variant, the aliphatic alcohol is selected from the group consisting of: methanol ($CH_3OH$), ethanol ($C_2H_5OH$), propanol ($C_3H_7OH$) and butanol ($C_4H_9OH$). These alcohols used in the process of the invention have the general chemical formula $C_nH_{2n+1}OH$ (where n=1 to 4). Other aliphatic alcohols can also be used, and the alcohol used has to be water-free.

In one variant, an excess of aliphatic alcohol is added to the crystal powder to form an aliphatic alcoholic suspension. In this variant, in which the process is carried out in suspension, the calcium fluoride powder and the ammonium salt of the complex fluoro acids can be slurried in the appropriate water-free aliphatic alcohol with stirring and dry ammonia can be introduced via a gas inlet tube. The suspension serves as reaction medium for the concerted esterification reaction with the hydroxide/fluoride conversion. The hydrofluoric acid (HF) formed as an intermediate reacts with oxidic constituents of the alkali metal fluoride or alkaline earth metal fluoride. The reaction mixture may have to be cooled. To form the raw crystal mass, the suspension is heated to boiling, resulting in the water/alcohol azeotrope distilling off. The ortho esters formed (e.g. triethyl orthophosphate, boiling point 215° C., or triethyl borate, boiling point 118° C., or tetraethyl orthosilicate, 168° C.) are subsequently removed under reduced pressure. A mixture of a plurality of different alcohols and a mixture of a plurality of different ammonium salts can optionally be used in the process.

The ammonium salt of the complex fluoro acid which is used is added to the crystal starting material (i.e. the crystal powder or the raw crystal mass) in an amount which ensures complete reaction with oxides, hydroxides and oxygen atoms in the starting material.

This amount can fluctuate within a wide range as a function of the purity of the starting material.

Amounts of 0.01-7% by weight, in particular 0.05-5%; by weight, have been found to be advantageous for the process of the invention.

The step of melting the raw crystal mass is preferably carried out under reduced pressure, in particular under a low vacuum, with pressures of not more than 200 mbar, in particular not more than 100 mbar, having been found to be advantageous.

In a further variant, at least the step of melting is carried out at temperatures in the range from 200° C. to 1450° C., preferably from 500° C. to 1400° C. The process or the esterification reaction is, in particular, carried out under conditions under which the crystal powder reacts well with the added substances in suspension or the raw crystal mass reacts well in the solid-state reaction. The HF ($NH_4F$) formed as an intermediate reacts with the oxidic alkaline earth metal substances (e.g. $Ca(OH)_2$) and forms the alkaline earth metal fluoride and water (or ammonia and water) which is removed azeotropically from the reaction mixture. The temperature range used here corresponds to the boiling point of the azeotrope.

The raw crystal mass or the crystal powder typically contains an alkali metal fluoride or alkaline earth metal fluoride, e.g. $CaF_2$, but $MgF_2$, LiF or doped fluoride crystals can also be used.

In a further variant, ammonia is additionally introduced into the crystal powder or the raw crystal mass. The introduction of the ammonia can be carried out in a targeted manner, e.g. via a gas inlet tube, or in another way.

The invention also relates to a fluoride crystal, in particular a calcium fluoride crystal, which has been produced by the above-described process and which contains from 0.01 ppm to 10 ppm of an ester of a complex fluoro acid. The crystal is formed by firstly purifying the molten raw crystal mass or the crystal powder as described above and subsequently solidifying the purified raw crystal mass by cooling, with a seed crystal being able to be used in order to grow an oriented single crystal from the raw crystal mass. All conventional crystal growing processes, e.g. the Stockberger-Bridgman process, the Czochralski process or the vertical gradient freeze process, can be used for growing a large fluoride single crystal.

A fluoride crystal obtained by the above-described process is essentially free of the (ortho) ester formed in the condensation reaction or has only a negligibly small proportion of this reaction product which is, for example, in the range from 0.01 ppm to 10 ppm and does not have an adverse effect on the optical properties of an optical component produced from the fluoride crystal. Thus, a (virtually) residue-free fluoride crystal which has a particularly high laser resistance is obtained.

Such a fluoride crystal, in particular a calcium fluoride crystal, can be used to obtain an optical component which has a saturation value of the absorption coefficient of less than $10 \times 10^{-4}$ l/cm, preferably less than $5 \times 10^{-4}$ l/cm. The saturation value of the absorption coefficient on long-term irradiation can be determined by the method described in DE 10 2009 030 203 A1 of the applicant, which is incorporated by reference into the present application.

Further features and advantages of the invention may be derived from the following description of examples of the invention with the aid of the figures of the drawing which show details important to the invention, and from the claims. The individual features can in each case be realized individually on their own or in any combination of a plurality thereof in a variant of the invention.

BRIEF DESCRIPTION OF THE DRAWINGS

Examples are shown in the schematic drawing and are explained in the following description. In the drawing, FIG. 1 schematically shows a chemical plant for the pretreatment of a crystal powder containing an alkali metal fluoride or alkaline earth metal fluoride, FIG. 2 schematically shows a crystal growing unit for producing a fluoride single crystal and FIG. 3 schematically shows a calcium fluoride blank with an optical component which can be produced therefrom.

DETAILED DESCRIPTION OF EXEMPLARY EMBODIMENTS

Figure 1:
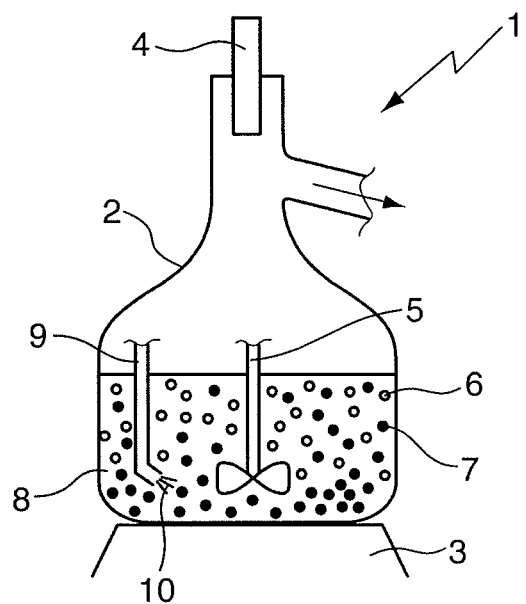

FIG. 1 shows a plant 1 designed for chemical reactions which has a reaction vessel 2, a heating/cooling apparatus 3 (for cooling and heating as desired), an outlet indicated by an arrow and also a temperature measuring device 4 (thermometer). The vessel 2 is provided with a stirrer 5 which serves to slurry a crystal powder 6, which in the present example contains calcium fluoride and oxidic impurities, and an ammonium salt 7 of a complex fluoro acid in a water-free aliphatic alcohol 8 with stirring.

Dry ammonia 10 is introduced via a gas inlet tube 9 into the vessel 2. When an exothermic reaction takes place, the reaction mixture present in the vessel 2 is cooled by the heating/cooling apparatus 3. In the reaction of the ammonium salt 7 with the alcohol 8 and the oxidic impurities, e.g. $Ca(OH)_2$, in suspension, these are converted into fluorides, e.g. into $CaF_2$, with gaseous materials or materials which are volatile at the pressures and temperatures used, in particular ammonia and water, being formed as further reaction products which can be discharged or distilled off via the outlet. Here, the fact that water forms azeotropes with alcohols is exploited. This is advantageous since the water formed in the reaction can be removed azeotropically by distillation, i.e. it is conveyed via the outlet to a water separator (not shown).

In the following, the water separator function is replaced by a distillation function (not shown) in the multifunctional plant 1, the suspension 6, 7, 8 is maintained at the boiling point by the heating/cooling apparatus 3 and, after a number of hours with stirring and separation of water, the alcoholic component 8 still present and further volatile constituents, in particular the ortho ester formed in the reaction (e.g. triethyl orthophosphate, boiling point 215° C., or triethyl borate, boiling point 118° C., or tetraethyl orthosilicate, boiling point 168° C.), are distilled off, toward the end of the distillation optionally with the aid of subatmospheric pressure or a vacuum. If reuse of the aliphatic alcohol is intended, this has to be appropriately purified and freed of water. The crystalline residue which remains forms a raw crystal mass 14 and is transferred to a crystal growing unit 11 which is shown in FIG. 2 and is described in more detail below.

In the above-described reaction, the amount of the ammonium salt 7 added is selected so that it reacts ideally completely with oxides, hydroxides and oxygen atoms present in the crystal powder 6. Depending on the purity of the crystal powder 6, the amount required for this purpose can fluctuate greatly, but is typically in the range from about 0.01 to 7% by weight, in particular from about 0.05 to 5% by weight.

To form fluoride crystals of other alkali metal fluorides or alkaline earth metal fluorides, the calcium fluoride in the crystal powder 6 has to be replaced by the appropriate alkali metal fluorides or alkaline earth metal fluorides. The ammonium salt of the complex fluoro acid which is added can be, in particular, an ammonium salt of a tetrafluoroboric acid, hexafluorophosphoric acid, hexafluorosilicic acid or hexafluorotitanic acid.

Figure 2:
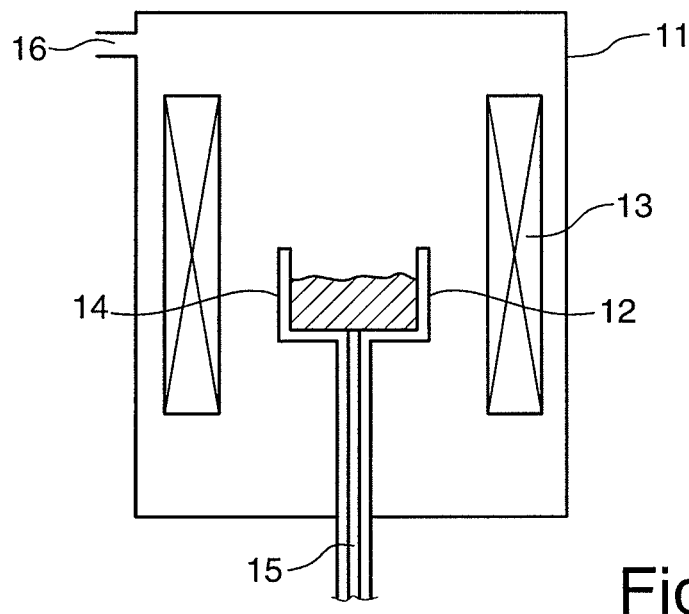

The crystal growing unit 11 shown schematically in FIG. 2 comprises a melting crucible 12 which can be heated via heating elements 13 and into which the raw crystal mass 14 has been introduced. The raw crystal mass 14 comprises, in the present case, largely pure calcium fluoride (in the form of a melt) which has been purified in aliphatic alcoholic suspension in the preceding process step.

The crystal growing unit 11 is closed and has an outlet 16 for discharge of remaining volatile reaction products which can form during melting of the raw crystal mass 14.

In the process described below, a low vacuum (typically less than 200 mbar, optionally less than 100 mbar) is applied to the crystal growing unit 11 and the raw crystal mass 14 is heated to a temperature at which it is in the molten state, so that volatile components present in the raw crystal mass 14 can be removed. Such temperatures are typically in the range from 200° C. to 1450° C., with temperatures in the range from 500° C. to 1400° C. having been found to be particularly advantageous. The temperatures used do not exceed the melting point of the fluoride material.

Due to the purification in the step which precedes melting and is described in relation to FIG. 1, the raw crystal mass 14 has virtually no oxygen defects and no residual amounts of scavenger and is therefore particularly suitable for applications which require a very high radiation resistance of the crystal material.

A single crystal is subsequently grown from the raw crystal mass 14 in the crystal growing unit 11, e.g. by bringing a crystal nucleus (not shown) into contact with the raw crystal mass 14 and slowly cooling the melt to form a single crystal (ingot).

A calcium fluoride crystal obtained in the above-described way has a proportion of the ester formed in the reaction in the range from 0.01 ppm (by weight) to 10 ppm (by weight). This proportion is low enough for the remaining ester residue not to have an adverse effect on the radiation resistance of the fluoride crystal, so that a saturation value of the absorption coefficient, which can be determined, for example, in the way described in DE 10 2009 030 203 A1 of the applicant, is less than $10 \times 10^{-4}$ l/cm, in particular less than $5 \times 10^{-4}$ l/cm.

The invention will be illustrated briefly in the following example:

Example

The minimum amount of the aliphatic alcohol required for the concerted esterification reaction is determined according to the stoichiometry of the following equation ($R = C_2H_5$) (in the present example using ammonium hexafluorophosphate):

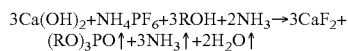

$$3Ca(OH)_2 + NH_4PF_6 + 3ROH + 2NH_3 \rightarrow 3CaF_2 + (RO)_3PO\uparrow + 3NH_3\uparrow + 2H_2O\uparrow$$

Since the reaction takes place in aliphatic alcoholic suspension, the alcoholic component is present in excess. The reaction products (apart from $CaF_2$), shown in the above equation, distill off, with, in particular, the water formed being able to be distilled off as azeotrope (ethanol/water mixture, boiling point about 78° C.). The formation of the ortho ester (of phosphoric acid) and the azeotrope formed can be monitored by the temperature of the distillate obtained via the outlet (cf. arrow in FIG. 1):

In the present example, 43 g of $NH_4PF_6$ (0.064 mol) as ammonium salt and 312.32 g of calcium fluoride ($CaF_2$) crystal powder (4 mol), both finely pulverized, were suspended in 1200 ml of dry ethanol in the reaction vessel 2 of FIG. 1, which was equipped with an internal temperature measuring device (temperature sensor 4), the mechanical stirrer 5, a water separator (not shown) and the gas inlet tube 9. 2.2 g (0.128 mol) of dry ammonia were subsequently introduced through the gas inlet tube and in the case of an exothermic reaction the reaction mixture was cooled so that it boiled only gently and an azeotropic distillation was subsequently carried out for two hours. The water separator was then replaced by a distillation attachment and the remaining solvent and the ortho ester formed were distilled off (toward the end with the aid of reduced pressure). The residue which remained was transferred to a growing furnace in order to draw a $CaF_2$ single crystal therefrom.

The calcium fluoride crystal obtained in the above-described way had a proportion of only about 5 ppm of orthophosphoric ester formed, for example, in the reaction. The other volatile reaction products had also been removed virtually completely from the crystal, so that the calcium fluoride crystal obtained in this way had a particularly high radiation resistance.

Figure 3:
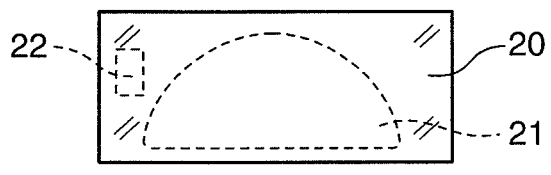

This was checked by irradiating $CaF_2$ blanks 20 obtained from the above-described process or a suitable specimen (cf. FIG. 3) with an energy density of >50 mJ/cm², with the absorption coefficient (k value) of the specimen being determined in each case after 1.5 gigapulses ($10^9$ single pulses) (cf. DE 10 2009 030 102 A1). Plotting the k values obtained against the pulse number (e.g.: 0, 1.5, 3, 4.5, 6 gigapulses) showed a saturation behavior, with the saturation value of the absorption coefficients $k_\infty$ being $<= 10 \times 10^{-4}$ l/cm, in most cases $<= 5 \times 10^{-4}$ l/cm. Optical components, e.g. in the form of a lens 21 as indicated in FIG. 3, which have a high radiation resistance can be produced from the $CaF_2$ blank 20. The lens 21 can, for example, form the final lens of a projection lens assembly or lenses subjected to a high level of irradiation in an illumination system for (immersion) lithography.

As an alternative to the above-described purification of the crystal powder 6 in alcoholic suspension, it is also possible to carry out the purification only in the raw crystal mass 14 in the crystal growing unit 11 of FIG. 2, i.e. in a fluid-solid reaction. In such a heterogeneous reaction, the reactants have to either come together at the phase boundary or go over from one phase into the other phase in order to be able to react with one another. A gas inlet tube 15 is provided in the crystal growing unit 11 for introduction of ammonia in such a reaction. The aliphatic alcohol can also be introduced here if such a procedure is chosen. The oxidic impurities are present in solid form, e.g. as CaO, in the raw crystal mass 14, but the reaction otherwise proceeds in the above-described way ($3CaO + NH_4PF_6 + 3ROH + 2NH_3 \rightarrow 3CaF_2 + (RO)_3PO\uparrow + 3NH_3\uparrow + 2H_2O\uparrow$, an excess of the aliphatic alcohol over the stoichiometric amount has to be used). If a suitable temperature profile is chosen for heating, the volatile reaction products formed in the fluid-solid reaction can be removed from the crystal growing unit 11 via the outlet 16.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A process for producing fluoride crystals resistant to ultraviolet radiation, which comprises:
    providing a crystal powder containing alkali metal fluoride or alkaline earth metal fluoride to form a raw crystal mass,
    introducing ammonia into at least one of the crystal powder or the raw crystal mass, melting the raw crystal mass in a crystal growing unit and solidifying the molten raw crystal mass by cooling,
wherein an ammonium salt of a complex fluoro acid and an aliphatic alcohol are added to the crystal powder or the raw crystal mass to decrease oxidic impurities.

2. The process as claimed in claim 1, wherein the complex fluoro acid is selected from the group consisting of: tetrafluoroboric acid ($HBF_4$), hexafluorophosphoric acid ($HPF_6$), hexafluorosilicic acid ($H_2SiF_6$) and hexafluorotitanic acid ($H_2TiF_6$).

3. The process as claimed in claim 1, wherein the aliphatic alcohol is selected from the group consisting of: methanol ($CH_3OH$), ethanol ($C_2H_5OH$), propanol ($C_3H_7OH$) and butanol ($C_4H_9OH$).

4. The process as claimed in claim 1, wherein an excess of aliphatic alcohol is added to the crystal powder to form an aliphatic alcoholic suspension.

5. The process as claimed in claim 1, wherein the ammonium salt of the complex fluoro acid is added in an amount of 0.01-7% by weight to at least one of the crystal powder or the raw crystal mass.

6. The process as claimed in claim 1, wherein at least said melting is carried out under a pressure of less than 200 mbar.

7. The process as claimed in claim 1, wherein at least said melting is carried out at temperatures in the range from 200° C. to 1450° C.

8. A fluoride crystal produced by a process as claimed in claim 1, wherein the fluoride crystal contains from 0.01 ppm to 10 ppm of an ester of a complex fluoro acid.

9. An optical component produced from a fluoride crystal as claimed in claim 8, which component has a saturation value of the absorption coefficient of less than $10 \times 10^{-4}$ l/cm.

10. The process as claimed in claim 1, wherein the fluoride crystals are calcium fluoride crystals.

11. The process as claimed in claim 5, wherein the ammonium salt of the complex fluoro acid is added in an amount of 0.02-5% by weight to at least one of the crystal powder or the raw crystal mass.

12. The process as claimed in claim 6, wherein said melting is carried out under a pressure of less than 100 mbar.

13. The process as claimed in claim 7, wherein said melting is carried out at temperatures in the range from 500° C. to 1400° C.

14. A fluoride crystal as claimed in claim 8, wherein the fluoride crystal is a calcium fluoride crystal.

15. An optical component produced from a fluoride crystal as claimed in claim 8, which component has a saturation value of the absorption coefficient of less than $5 \times 10^{-4}$ l/cm.

* * * * *